(12) United States Patent
Kalish et al.

(10) Patent No.: US 9,306,167 B2
(45) Date of Patent: Apr. 5, 2016

(54) FIELD EMISSION DEVICE AND METHOD OF FABRICATING THE SAME

(71) Applicant: Technion Research & Development Foundation Ltd., Haifa (IL)

(72) Inventors: Rafael Kalish, Haifa (IL); Moshe Tordjman, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 89 days.

(21) Appl. No.: 13/743,382

(22) Filed: Jan. 17, 2013

(65) Prior Publication Data

US 2013/0187123 A1 Jul. 25, 2013

Related U.S. Application Data

(60) Provisional application No. 61/588,354, filed on Jan. 19, 2012.

(51) Int. Cl.
*B82Y 30/00* (2011.01)
*H01L 49/00* (2006.01)
*H01J 1/304* (2006.01)
*B82Y 99/00* (2011.01)
*B82Y 10/00* (2011.01)

(52) U.S. Cl.
CPC .............. *H01L 49/006* (2013.01); *H01J 1/3048* (2013.01); *B82Y 10/00* (2013.01); *B82Y 99/00* (2013.01)

(58) Field of Classification Search
None
See application file for complete search history.

(56) References Cited

U.S. PATENT DOCUMENTS

| 5,698,328 | A  | * | 12/1997 | Bunshah et al. | 428/408 |
| 6,017,630 | A  | * | 1/2000  | Tanaka et al.  | 428/402 |
| 2002/0024279 | A1 | * | 2/2002  | Simpson et al. | 313/309 |
| 2002/0110220 | A1 | * | 8/2002  | Shen et al.    | 378/124 |
| 2006/0261719 | A1 | * | 11/2006 | Fox            | 313/311 |
| 2007/0085035 | A1 | * | 4/2007  | Frosien        | 250/492.3 |
| 2010/0129457 | A1 | * | 5/2010  | Razavi         | 424/489 |
| 2010/0209665 | A1 | * | 8/2010  | Konovalov et al. | 428/141 |
| 2010/0289020 | A1 | * | 11/2010 | Yano et al.    | 257/43 |

OTHER PUBLICATIONS

Physical Properties of Fullerenes. 2010. https://sesres.com/physicalproperties.asp.*
Mares et al., "Influence of Ambient Humidity on the Surface Conductivity of Hydrogenated Diamond", Diamond and Related MAterials, 17, 1356-1361, 2008.*
Examiner calculation related to claim 3. 2014.*
Bhattacharyya et al. "Resonant Tunneling and Fast Switxhing in Amorphous-Carbon Quantum-Well Structures", Nature Materials, 5: Jan. 19-22, 2006.
Bolker et al. "Two-Dimensional and Zero-Dimensional Quantization of Transfer-Doped Diamond Studied by Low-Temperature Scanning Tunneling Spectroscopy", Physical Review B, 83: 155434-1-155434-7, 2011.

(Continued)

*Primary Examiner* — Whitney T Moore
*Assistant Examiner* — Scott R Wilson

(57) ABSTRACT

A field-emission device is disclosed. The device comprises a solid state structure formed of a crystalline material and an amorphous material, wherein an outer surface of the solid state structure is substantially devoid of the amorphous material, and wherein a p-type conductivity of the crystalline material is higher at or near the outer surface than far from the outer surface.

29 Claims, 6 Drawing Sheets

(56) References Cited

OTHER PUBLICATIONS

Chakrapani et al. "Charge Transfer Equilibria Between Diamond and an Aqueous Oxygen Electrochemical Redox Couple", Science, 318: 1424-1430, Nov. 30, 2007.

Chen et al. "Surface Transfer Doping of Semiconductors", Progress in Surface Science, 84: 279-321, 2009.

Duke et al. "Field Emission Through Atoms Adsorbed on a Metal Surface", The Journal of Chemical Physics, 46: 923-937, 1967.

Ferrari et al. "Density, Sp3 Fraction and Cross-Sectional Structure of Amorphous Carbon Films Determined by X-Ray Reflectivity and Electron Energy-Loss Spectroscopy", Physical Review B, 62(16): 11089-11103, Oct. 15, 2000.

Filip et al. "Two-Step Electron Tunneling From Confined Electronic States in a Nanoparticle", Physical Review B, 79: 245429-1-245429-8, 2009.

Gadzuk et al. "Field Emission Energy Distribution (FEED)", Reviews of Modem Physics, 45(3): 487-550, Jul. 1973.

Gan et al. "Quantization of 2D Hole Gas in Conductive Hydrogenated Diamond Surfaces Observed by Electron Field Emission", Physical Review Letters, 96: 196808-1-196808-4, May 19, 2006.

Gan et al. "The Effect of Grain Boundaries and Adsorbates on the Electrical Properties of Hydrogenated Ultra Nano Crystalline Diamond", Diamond and Related Materials, 18: 1118-1122, 2009.

Green et al. "A 160-Kilobit Molecular Electronic Memory Patterned at 10[11] Bits per Square Centimetre", Nature, 445: 414-417, Jan. 25, 2007.

Gruen "Nanocrystalline Diamond Films", Annual Review of Material Science, 29: 211-259, 1999.

Karahutov et al. "Diamond / Sp2-Bonded Carbon Structures: Quantum Well Field Electron Emission?", Diamond and Related Materials, 10: 840-846, 2001.

Laikhtman et al. "Interaction of Water Vapor With Bare and Hydrogenated Diamond Film Surface", Surface Science, 551: 99-105, 2004.

Li et al. "Electronic Two-Terminal Bistable Graphitic Memories", Nature Materials, 7: 966-971, Dec. 2008.

Litovchenko et al. "Quantum-Size Resonance Tunneling in the Field Emission Phenomenon", Journal of Applied Physics, 96(1): 867-877, Jul. 1, 2004.

Lu et al. "Nanoelectronics From the Bottom Up", Nature Materials, 6: 841-850, Nov. 2007.

Lyth et al. "Resonant Behavior Observed in Electron Field Emission From Acid Functionalized Multiwall Carbon Nanotubes", Applied Physics Letters, 94: 123102-1-123102-3, 2009.

Madaleno et al. "Electron Field Emission From Patterned Nanocrystalline Diamond Coated A-SiO2 Micrometer-Tip Arrays", Applied Physics Letters, 92: 023113-1-023113-3, 2008.

Maier et al. "Origin of Surface Conductivity in Diamond", Physical Review Letters, 85(16): 3472-3475, Oct. 16, 2000.

Mares et al. "Influence of Ambient Humidity on the Surface Conductivity of Hydrogenated Diamond", Diamond and Related Materials, 17: 1356-1361, 2008.

Ouyang et al. "Programmable Polymer Thin Film and Non-Volatile Memory Device", Nature Materials, 3: 918-922, Dec. 2004.

Plummer et al. "Resonance Tunneling of Field Emitted Electrons Through Adsorbates on Metal Surfaces", Solid State Communications, 7: 487-491, 1969.

Reddy et al. "Multilevel Conductance Switching in Organic Memory Devices Based on AlQ3 and Al/Al2O3 Core-Shell Nanoparticles", Applied Physics Letters, 94: 173304-1-173304-3, 2009.

Robertson "Diamond-Like Amorphous Carbon", Materials Science and Engineering Reports, 37: 129-281, 2002.

Satyanarayana et al. "Field Emission From Tetrahedral Amorphous Carbon", Applied Physics Letters, 71(10): 1430-1432, Sep. 8, 1997.

Semet et al. "Electron Emission Through a Multilayer Planar Nanostructured Solid-State Field-Controlled Emitter", Applied Physics Letters, 84(11): 1937-1939, Mar. 15, 2004.

Stewart et al. "Molecule-Independent Electrical Switching in Pt/Organic Monolayer/Ti Devices", Nano Letters, 4(1): 133-136, 2004.

Strobel et al. "Surface Transfer Doping of Diamond", Nature, 430: 439-441, Jul. 22, 2004.

Teo et al. "Carbon Nanotubes as Cold Cathodes", Nature, 437: 968, Oct. 13, 2005.

Tsang et al. "Negative Differential Conductance Oberserved in Electron Field Emission From Band Gap Modulated Amorphous-Carbon Nanolayers", Applied Physics Letters, 89: 193103-1-193103-3, 2006.

Wang et al. "Field Emission Enhancement by the Quantum Structure in an Ultrathin Multilayer Planar Cold Cathode", Applied Physics Letters, 92: 142102-1-142102-3, 2008.

Yamada et al. "Resonant Field Emission From Two-Dimensional Density of State on Hydrogen-Terminated Intrinsic Diamond", Journal of Applied Physics, 107: 013705-1-013705-5, 2010.

Yang et al. "Memristive Switching Mechanism for Metal/Oxide/Metal Nanodevices", Nature Nanotechnology, 3: 429-433, Jul. 2008.

Yeganeh et al. "Atomic Hydrogen Treatment of Nanodiamond Powder Studied With Photoemission Spectroscopy", Physical Review B, 75: 155404-1-155404-8, 2007.

\* cited by examiner

FIELD EMISSION DEVICE AND METHOD OF FABRICATING THE SAME

RELATED APPLICATION

This application claims the benefit of priority under 35 USC 119(e) of U.S. Provisional Patent Application No. 61/588,354 filed Jan. 19, 2012. The contents of the above application are incorporated by reference as if fully set forth herein in their entirety.

FIELD AND BACKGROUND OF THE INVENTION

The present invention, in some embodiments thereof, relates to a solid state device and, more particularly, but not exclusively, to a field emission device and method of fabricating the same.

Nanoscale memory-switch circuits are useful in many applications including, without limitation, logic, memory and processing devices. These devices set the basic efficiency of these devices. The realization of nanoscale memory-switch circuits has been attempted on various types of materials employing nonlinear resistance effects or quantum electronic transport phenomena [1]. Memory effects have been demonstrated in organic materials [2,3], showing viable bistable switching characteristics. High-speed switching has been ameliorated in solid state heterostructures, exploiting double-barrier resonant tunneling principles in hybrid composites of amorphous carbon [4].

Field emission (FE) from quantum assemblies have been theoretically predicted and experimentally shown to have useful properties due to sequential tunneling along confined structures [7-11]. Various configurations showing anomalies in current-voltage (I-V) curves, such as regions with negative differential conductance [7-12] and steps in the I-V characteristics [13, 14], have been observed. FE resonant tunneling have been investigated in metal samples containing adsorbates on surfaces [15-17].

Recently, resonant behavior has been reported from multiwall carbon nanotubes covered by chemisorbed molecules exhibiting some weak step-like properties in the field emission [18]. These weak step-like properties have been attributed to resonant tunneling through quantum states formed by the presence of the adsorbate layer. Abrupt switch-on step-like feature has also been reported for non-hydrogenated nanocrystalline diamond microtip arrays [19].

SUMMARY OF THE INVENTION

According to an aspect of some embodiments of the present invention there is provided a field-emission device. The device comprises a solid state structure formed of a crystalline material and an amorphous material, wherein an outer surface of the solid state structure is substantially devoid of the amorphous material, and wherein a p-type conductivity of the crystalline material is higher at or near the outer surface than far from the outer surface.

According to an aspect of some embodiments of the present invention there is provided a method of producing current. The method comprises applying voltage to a solid state structure formed of a crystalline material and an amorphous material, wherein an outer surface of the solid state structure is substantially devoid of the amorphous material, and wherein a p-type conductivity of the crystalline material is higher at or near the outer surface than far from the outer surface.

According to an aspect of some embodiments of the present invention there is provided a method of fabricating field-emission device. The method comprises treating a surface of a solid state structure formed of a crystalline material and an amorphous material, so as to etch the amorphous material from the surface.

According to some embodiments of the invention the surface is treated by exposing the surface to humidity so as to from an adsorption layer at the outer surface.

According to some embodiments of the invention the surface is treated by modifying the surface by foreign atoms. According to some embodiments of the invention the modification comprises inducing hydrogenation and wherein the foreign atoms are hydrogen atoms.

According to some embodiments of the invention the surface is treated by cleaning the surface with an acid.

According to some embodiments of the invention the treating is executed, at least in part, at a temperature of at least 400° C.

According to some embodiments of the invention the crystalline material comprises a plurality of crystalline nanostructures, wherein the crystalline nanostructures are embedded in the amorphous material.

According to some embodiments of the invention the crystalline nanostructures are characterized by an average diameter of from about 3 nm to about 30 nm, and wherein an average distance between adjacent crystalline nanostructures is less than 3 nm.

According to some embodiments of the invention the crystalline nanostructures are diamond nanostructures.

According to some embodiments of the invention the amorphous material is amorphous carbon.

According to some embodiments of the invention the amorphous material is tetrahedral amorphous carbon.

According to some embodiments of the invention the crystalline material comprises at least one structure selected from the group consisting of a diamond multilayer structure, a fullerene multilayer structure, a carbon nanotube multilayer structure, a graphene layer structure, and a graphene multilayer structure.

According to some embodiments of the invention the crystalline material comprises at least one layer selected from the group consisting of a homoepitaxial diamond layer, a polycrystalline diamond layer, and a layer of diamond nanostructures.

According to some embodiments of the invention the surface is modified by foreign atoms.

According to some embodiments of the invention the foreign atoms are covalently attached to the surface.

According to some embodiments of the invention the foreign atoms are hydrogen atoms. According to some embodiments of the invention the foreign atoms comprise at least one atom are selected from the group consisting of oxygen, nitrogen, fluorine, boron and phosphor.

According to some embodiments of the invention the device further comprises an adsorbed layer at the outer surface.

According to some embodiments of the invention the adsorbed layer is characterized by a chemical potential below a characteristic valence band energy level of the surface.

According to some embodiments of the invention the adsorbed layer is characterized by electron affinity above 4.2 eV.

According to some embodiments of the invention the adsorbed layer is an aqueous layer.

According to some embodiments of the invention the adsorbed layer comprises at least one substance selected from the group consisting of fullerene and fullerene fluorinated.

According to some embodiments of the invention a thickness of the adsorbed layer is from about 0.1 nm to about 10 nm.

According to some embodiments of the invention the solid state structure is characterized by a current-voltage hysteresis loop at room temperature.

According to some embodiments of the invention the solid state structure features a current rise of at least two orders of magnitude over a change of less than 50% in voltage bias applied to the solid state structure.

According to an aspect of some embodiments of the present invention there is provided a display system, comprising the device as delineated above and/or further exemplified hereinunder.

According to an aspect of some embodiments of the present invention there is provided an X-ray source system, comprising the device as delineated above and/or further exemplified hereinunder.

According to an aspect of some embodiments of the present invention there is provided an electron emission system, comprising the device as delineated above and/or further exemplified hereinunder.

According to an aspect of some embodiments of the present invention there is provided an electron microscope, comprising the device as delineated above and/or further exemplified hereinunder.

According to an aspect of some embodiments of the present invention there is provided an electrical switch system, comprising the device as delineated above and/or further exemplified hereinunder.

According to an aspect of some embodiments of the present invention there is provided a logic circuit, comprising the device as delineated above and/or further exemplified hereinunder.

According to an aspect of some embodiments of the present invention there is provided a memory system, comprising the device as delineated above and/or further exemplified hereinunder.

According to an aspect of some embodiments of the present invention there is provided a sensor system, comprising the device as delineated above and/or further exemplified hereinunder.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 1A-D show Ultrananocrystalline Diamond (UNCD) layer, wherein FIG. 1A shows a cross sectional high-resolution SEM image of the UNCD layer grown on quartz, FIG. 1B shows 3D AFM topography image of the UNCD, FIG. 1C shows 2D contact AFM of the UNCD plane view, and FIG. 1D shows the corresponding profile of typical diamond grain sizes.

DESCRIPTION OF SPECIFIC EMBODIMENTS OF THE INVENTION

Figure 1A:
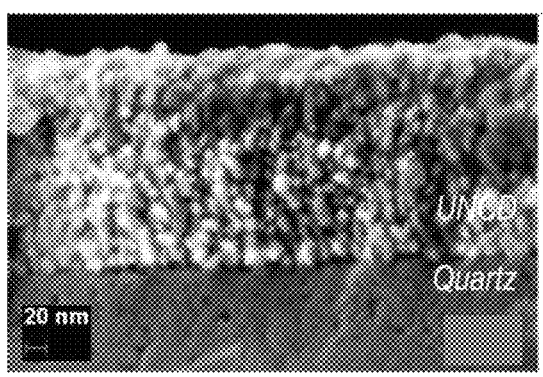

The present invention, in some embodiments thereof, relates to a solid state device and, more particularly, but not exclusively, to a field emission device and method of fabricating the same.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 7:
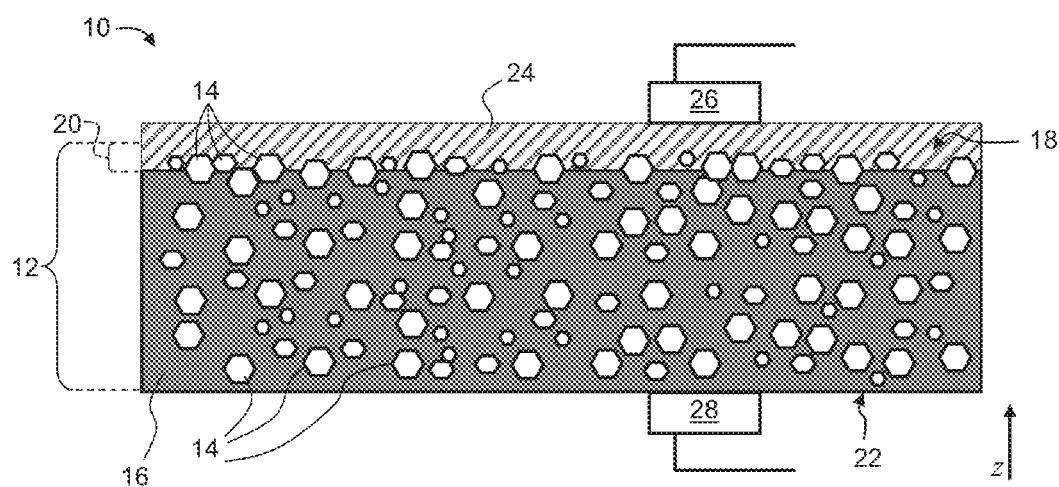
FIG. 7 is a schematic illustration of a field-emission device 10, according to some embodiments of the present invention.

Referring now to the drawings, FIG. 7 is a schematic illustration of a field-emission device 10, according to some embodiments of the present invention. Device 10 preferably comprises a solid state structure 12 formed of a crystalline material 14 and an amorphous material 16.

In the embodiment illustrated in FIG. 7, which is not to be considered as limiting, crystalline material 14 is in the form of a plurality of crystalline nanostructures. The nanostructures can be embedded in an amorphous material 16.

The term "nanostructure," as used herein, refers to a structure having a highest dimension which is above 1 nm and less than 100 nm or less than 50 nm, or less than 40 nm, e.g., from about 3 nm to about 30 nm or from about 5 nm to about 15.

The term "crystalline nanostructure," refers to a nanostructure which is in a solid form and in which the constituent atoms, molecules, or ions are packed in a regularly ordered, repeating pattern extending in all three spatial dimensions.

The term "long range order" as used herein generally refers to the order observed across a substrate of at least 1 square micron, or even several square microns, or in some cases, at least 1 square millimeter.

The crystalline nanostructures of the present embodiments optionally and preferably have the property of long range order, wherein the ordered repeating pattern extends over at least 1 square micron.

Crystalline material 14 is preferably a carbon-based crystalline material, such as, but not limited to, diamond, diamond nanostructures, carbon nanotube, fullerene, fullerene nano structures, and graphene.

In some embodiments of the present invention the crystalline nanostructures are ultrananocrystalline diamond (UNCD) structures. UNCD are known per se and are disclosed in numerous publications (see, for example, ref. [20]). A suitable process for producing UNCD structures by microwave plasma enhanced chemical vapor deposition (MPCVD) is disclosed, for example, in U.S. Pat. No. 5,462,776, the contents of which are hereby incorporated by reference.

In some embodiments of the present invention crystalline material 14 is constituted as a thin film (e.g., 300 nm in thickness) diamond multilayer. Each diamond layer can be either homoepitaxial single crystal diamond or polycrystalline diamond, and is optionally doped with at least one foreign atom selected from the group consisting boron, nitrogen, phosphor and fluorine.

In some embodiments of the present invention the crystalline material is constituted as other carbon based material interfaces, such as, but not limited to, thin fullerene and/or carbon nanotube multi-layers with homoepitaxial diamond layer, polycrystalline diamond layer or nanostructured diamond grains.

In some embodiments of the present invention crystalline material is constituted as a graphene single layer or multilayer with homoepitaxial diamond thin layer or polycrystalline diamond thin layer or nano structured diamond grains.

The term "amorphous material" encompasses all materials or alloys which lack the long range order, although they may have short or intermediate range order, or even contain, at times, crystalline inclusions.

Amorphous material 16 is optionally and preferably an amorphous carbon.

As used herein "amorphous carbon" means a substance which is composed of the element carbon and does not have such a well-defined crystal structure as found in diamond and graphite. The term "amorphous carbon" is intended to include those carbon material having dangling bonds terminated with hydrogen or nitrogen or the like. A carbon material, in which an amorphous carbon network-type structure that contains bonded hydrogen atoms exists, is known in the literature as "amorphous hydrogenated carbon" denoted "a-C:H".

The amorphous carbon of the present embodiments can be an $sp^2$ bonded carbon, an $sp^3$ bonded carbon, or a mixture of $sp^2$ bonded carbon and an $sp^3$ bonded carbon. $Sp^2$ bonded carbon refers to double bonded carbon, and $sp^3$ bonded carbon refers to single bonded carbon. An amorphous carbon with high level of $sp^3$ bonded carbon is known in the art as tetrahedral amorphous carbon (ta-C). In various exemplary embodiments of the invention amorphous material 16 comprises tetrahedral amorphous carbon. The amorphous carbon and nanostructures of the present embodiments can form a multilayer structure. For example, solid state structure 12 can be made of a thin film diamond multilayer with amorphous carbon multilayer heterojunctions.

In various exemplary embodiments of the invention amorphous material 16 and nanostructures 14 are selected such that the ground state energy level of amorphous material 16 is lower than the conduction band minimum (CBM) of nanostructures 14.

While nanostructures 14 are illustrated in FIG. 7 as considerably spaced apart from each other this need not necessarily be the case, since, in various exemplary embodiments of the invention amorphous material 16 occupies voids between closely packed nanostructures. The solid state structure of the present embodiments is preferably a generally periodic heterostructure of crystalline nanostructures and amorphous material pockets. The average distance between adjacent crystalline nanostructures is preferably less than 3 nm or less than 2 nm or less than 1 nm. It is appreciated that this average distance is the average diameter of the amorphous material pockets.

Structure 12 can have any shape. In some embodiments of the present invention structure 12 is shaped as a film which can be planar or non-planar, as desired. The thickness of structure 12 is preferably, but not necessarily, less than 1000 nm or less than 800 nm or less than 600 nm or less than 400 nm. In experiments performed by the present inventors a solid state structure, about 300 nm in thickness, was used. The thickness direction of solid state structure 12 is referred to herein as the z direction.

In various exemplary embodiments of the invention one or more outer surfaces of structure 12 is substantially devoid of the amorphous material 16.

As used herein "substantially devoid of the amorphous material" means that at least 50% or at least 60% or at least 70% or at least 80% or at least 90% of the area of the surface does not include the amorphous material.

A representative example of such outer surface is generally shown at 18. As illustrated, while the amorphous material 16 extends to some of the surfaces (see, e.g., surface 22, opposite to surface 18) of structure 12, surface 18 does not include amorphous material 16. A layer 20 at outer surface 18 which is substantially devoid of material 16 has a thickness which is preferably from about 0.1 nm to about 2 nm.

A suitable procedure for determining whether or not or to what extent amorphous material 16 engages an outer surface of structure 12, is by electron microscopy. As demonstrated in the Examples section that follows, an electron microscope has sufficient resolution to distinguish between crystalline nanostructures and amorphous material, and can therefore be employed for determining presence or absence of amorphous material at a particular surface.

According to some embodiments of the present invention, a p-type conductivity of crystalline nanostructures 14 is higher at or near outer surface 18 than far from outer surface 18.

Preferably, the crystalline nanostructures at surface 18 are p-type conductive, while the p-type conductivity of crystalline nanostructures in the bulk of structure 12 (e.g., more than 5 nm or more than 10 nm or more than 20 nm or more than 30 nm below surface 18) is zero or suppressed by at least 2 orders of magnitudes relative to the p-type conductivity of the crystalline nanostructures within region 20.

P-type conductivity at surface 18 and/or layer 20 can be achieved by any technique known in the art. In some embodiments of the present invention a surface transfer doping process is employed. Surface transfer doping is a known process and is found in many publications (see, for example, Chen et al., "Surface transfer doping of semiconductors," Progress in Surface Science 84 (2009) 279-321). Generally, surface 18 is brought together with surface acceptors, such as, but not limited to, solvated electrochemical species (e.g., $O_2$ red/ox couple), isolated molecules, or solid adsorbates. The Fermi energy difference between nanostructures 14 and the surface acceptors induces interfacial charge transfer in which electrons from the valence band of nanostructures 14 are driven to the electronic empty acceptor levels of the surface acceptors. This results in accumulation of holes in the valence band of nanostructures 14. During charge transfer, the Fermi level of the surface acceptors is raised until a thermodynamic equilibrium is established at which time the Femi levels of nanostructures 14 and the surface acceptors are aligned. Other techniques for providing the nanostructures at surface 18 and/or in layer 20 with p-type conductivity, such as, but not limited to, ion implantation and/or solid-source thermal diffusion processes, are not excluded from the scope of the present invention.

The electron affinity the crystalline nanostructures at surface 18, and optionally of the crystalline nanostructures in layer 20, is preferably negative. Typically, but not necessarily, the electron affinity $\chi$ of the nanostructures at surface 18 and/or layer 20 is from about −2 eV to about −1 eV. For example, when nanostructures 14 are UNCD structures, their electron affinity is about −1.3 eV.

It was found by the present inventors that solid state structure 12 is suitable for inducing electron field emission upon application of voltage bias between surface 18 and surface 22. Voltage bias can be applied using an anode 26 in electrical communication with surface 18 and a cathode in electrical to surface 22, wherein anode 26 and cathode 28 are connected to a voltage source (not shown) as known in the art. Typically voltage levels for inducing electron field emission are from about 0.1 volt to about 100 volts, or from about 0.1 volt to about 50 volts, or from about 0.1 volt to about 25 volts, or from about 0.1 volt to about 10 volts or from about 0.1 volt to about 5 volts. Other voltage levels not excluded from the scope of the present invention, and the ordinarily skilled person being familiar with the potential barriers constituted by the materials forming structure 12, would know how to select the voltage levels for a given thickness of structure 12.

Electron field emission can occur at layer 20, in which case the electrons are emitted from nanostructures 14, and/or at the bulk of solid state structure 12 (e.g., at least 5 nm or at least 10 nm or at least 20 nm or at least 30 nm below surface 18) in which case the electrons are emitted from amorphous material 16. Typically, the number of emissions from amorphous material 16 increases monotonically with the voltage bias.

In some embodiments of the present invention outer surface 18 is terminated by foreign atoms. Preferably, the foreign atoms are covalently attached to nanostructures 14. The foreign atoms serve for shifting the potential barrier constituted by the nanostructures at surface 18 and/or layer 20. Preferably, the potential barrier is shifted towards greater energy so that the potential barrier constituted by the nanostructures at surface 18 and/or layer 20 is higher than the CBM of the nanostructures at the bulk of structure 12 (e.g., at least 5 nm at least 10 nm or at least 20 nm or at least 30 nm below surface 18). In any event, the shift forms an asymmetric quantum well (QW) at amorphous material 16, which QW having a first potential barrier at the nanostructures in the bulk of structure 12 and a second potential barrier (which is different, preferably higher than the first potential barrier) at the nanostructures in layer 20 or at surface 18. A representative band diagram showing an asymmetrical QW 40 characterized by energy $E_{QW1}$ between a first potential barrier 42 characterized by energy $E_{B1}$ and a second potential barriers 44 characterized by energy $E_{B2}$ is provided in FIG. 4 of the Examples section that follows.

Any atom that can form a covalent bond with nanostructures 14 can be used as a modifier atom. One representative example includes a hydrogen atom. Other examples, including, without limitation, oxygen, nitrogen, fluorine, boron and phosphor.

Modification of surface 18 can be done, for example, by subjecting the surface to a plasma treatment, e.g., using microwaves or high-frequency power. When the foreign atoms are hydrogen atoms, the plasma is preferably hydrogen plasma. Hydrogen plasma can be applied in a chemical vapor deposition reactor at a temperature of from about 500° C. to about 500° C., e.g., about 650° C. for a predetermined time period. Typically, surface 18 is exposed to plasma for a period of from about 20 minutes to about 60 minutes, e.g., about 40 minutes.

Figure 4:
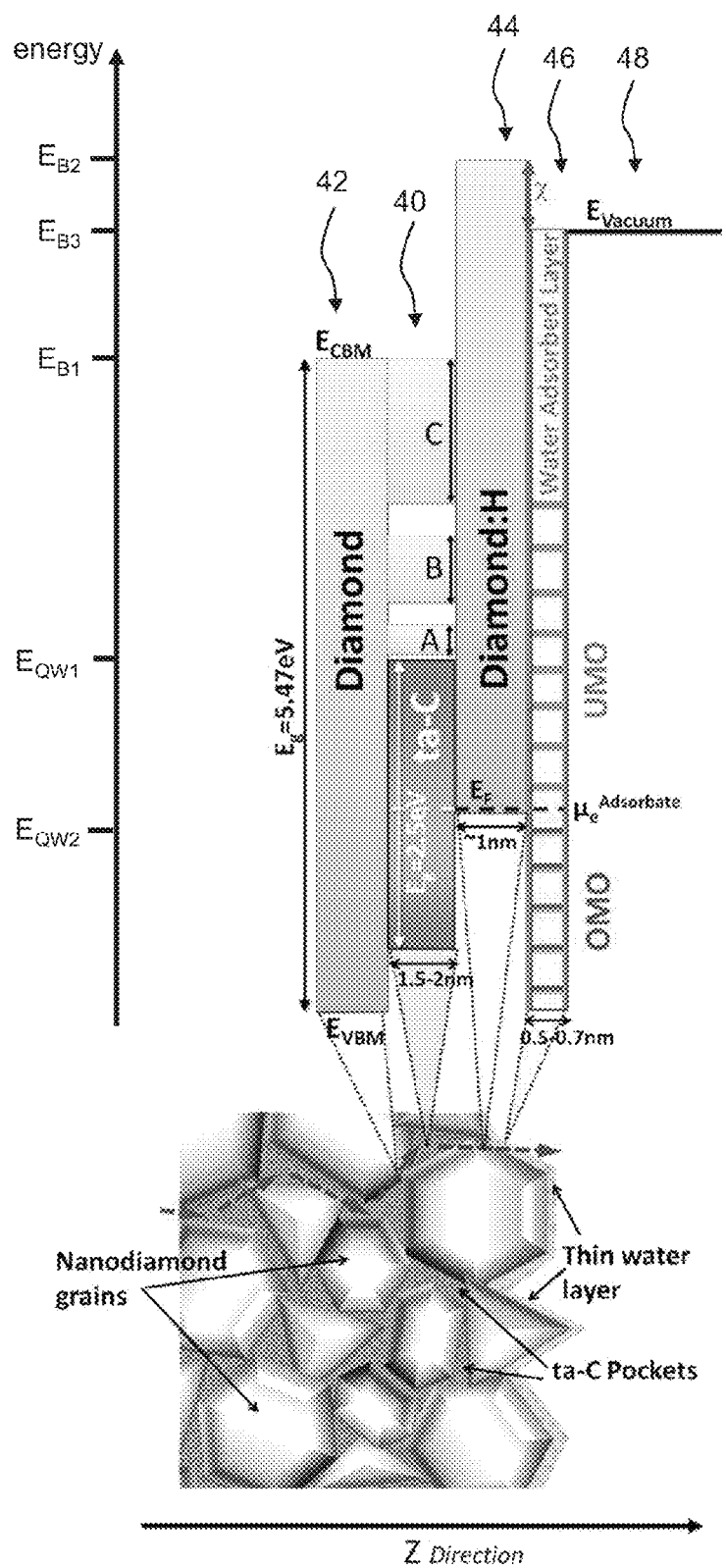
FIG. 4 is a schematic illustration showing band diagram of the nano diamond grains and ta-C pockets periodic heterostructure, according to some embodiments of the present invention.

In some embodiments of the present invention device 10 comprises an adsorbed layer 24 at outer surface 18. Adsorbed layer 24 is preferably characterized by a chemical potential which is below the characteristic valence band energy level of surface 18 or layer 20. With reference to FIG. 4, the chemical potential $\mu$ of layer 24 is preferably below $E_{B2}$. In various exemplary embodiments of the invention the chemical potential $\mu$ of layer 24 is also below the CBM of the nanostructures in the bulk of structure 12 (see $E_{B1}$ in FIG. 4). Preferably, but not necessarily, layer 24 has electron affinity which is above 4.2 eV.

In some embodiments, layer 24 is an aqueous layer, e.g., a layer of adsorbed water. Also contemplated are adsorbed layers that comprise fullerene ($C_{60}$) and/or fullerene fluorinated ($C_{60}F_{48}$).

The thickness of layer 24 is preferably from about 0.1 nm to about 10 nm. In some embodiments of the present invention layer 24 is a monolayer. In other embodiments layers 24 includes several to several tens of monolayers.

When layer 24 is an aqueous layer, it can be formed, for example, by exposing surface 18 to moisture for a predetermined time period.

Thus, layer 24 enacts a second QW 46 (not shown in FIG. 7, see FIG. 4) characterized by energy $E_{QW2}$ between potential barrier 42 and a third potential barrier 48 characterized by energy $E_{B3}$, wherein third potential barrier 48 corresponds to the space outside structure 12 (e.g., vacuum).

Thus, the present embodiments contemplate a device having a double-barrier junction with a band diagram having two QWs, wherein a first QW corresponds to amorphous material 16 and a second QW corresponds to layer 24, and two potential barriers, wherein a first potential barrier corresponds to nanostructures in the bulk of structure 12 and first potential barrier corresponds to nanostructures at surfed 18 or in layer 20. Without wishing to be bound to any specific theory, the present inventors postulate that such energy configuration facilitates electron field emission through or from region 20.

The present inventors found that the solid state structure of the present embodiments features a current rise of at least N orders of magnitude over a change of less than Y % in voltage bias applied to the solid state structure, wherein N equals 2 or 3 or 4, and wherein Y equals 50 or 40 or 30.

The present inventors have also found that the solid state structure of the present embodiments is characterized by a current-voltage hysteresis loop at room temperature. Representative examples of characteristic current-voltage hysteresis loop are discussed in the Examples section that follows (see FIG. 2, x lines). The parameters describing the shape of the current-voltage hysteresis loop can be controlled by a judicious selection of the p-type conductivity at surface 18, which in turn can be controlled by a judicious selection of nanostructures 14 and material 16, and optionally of layer 24 and/or the foreign atoms terminating surface 18. In some embodiments of the present invention the characteristic current-voltage hysteresis loop of structure 12 has an hysteresis on/off ratio of at least 100:1 or at least 500:1 or at least 1000:1 or at least 5000:1, e.g., 10,000:1.

As used herein "hysteresis on/off ratio" when used in connection to current-voltage hysteresis loop, refers to the ratio between the average current level at the upper plateau of the hysteresis loop and the average current level at the lower plateau of the hysteresis loop. For example, the current at the lower plateau of the hysteresis loop can be the current through the anode while the voltage between the anode and the cathode is increased but is below the threshold voltage for triggering abrupt electron field emission, and the current at the upper plateau of the hysteresis loop can be the current through the anode while the voltage between the anode and the cathode is reduced but is above the threshold voltage at which the electron field emission is suppressed.

Device 10 can be used in many applications. Preferably, device 10 is operated in vacuum conditions (for example, at a pressure less than 1 torr or less than $10^{-1}$ torr or less than $10^{-2}$ torr or less than $10^{-3}$ torr or less than $10^{-4}$ torr or less than $10^{-5}$ torr or less than $10^{-6}$ torr or less than $10^{-7}$ torr or less than $10^{-8}$ torr e.g., $10^{-9}$ torr or less).

In some embodiments of the present invention device 10 is used as or incorporated in a source for electron field emission. Such source can be employed in various systems, including, without limitation, flat panel display systems, X-ray source systems, electron microscope system (e.g., emission electron microscope system or scanning electron microscope system). The present inventors found that device 10 is particularly useful for this type of system since the effective spot dimensions for the electron field emission can be less than 30 nm or less than 20 nm or less than 15 nm, e.g., from about 5 nm to about 15 nm.

In some embodiments of the present invention device 10 is used as or incorporated in an electrical switching system. In these embodiments, the current-voltage hysteresis loop can be exploited for switching. Other systems which can exploit current-voltage hysteresis loop can also comprise device 10. These include, but are not limited to, any electrical component or circuitry which perform activation and deactivation, e.g., logic gate circuits, microprocessors, and the like.

In some embodiments of the present invention device 10 is used as or incorporated in a memory system. In these embodiments, the current-voltage hysteresis loop can be used to filter signals so that the output reacts slowly by taking recent history into account and can be intentionally added to an electronic circuit (or digital algorithm) to prevent unwanted rapid switching. Generally, the current-voltage hysteresis loop is useful in any electrical circuit which is designed to temporarily store changes in current by changing its resistance. A representative example of such electrical circuit is a circuit element known as "memristor".

In some embodiments of the present invention device 10 is used as or incorporated in a system that features heterojunction tunneling, such as, but not limited to, a diode system, particularly resonant tunneling diode, and a transistor, particularly a field effect transistor.

In some embodiments of the present invention device 10 is used as or incorporated in a current amplification system, exploiting the characteristic abrupt current rise of structure 12. The abrupt current rise can also be exploited in other systems such as sensor systems in which the two level current property can be used as a sensing indicator.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

The present inventors realized that it is advantageous to have a memory switch device with reliable bistable conductance properties, in robust solid state materials such as diamond. The present Examples describe a bistable current with reversible switching effect from surface transfer doped ultrananocrystalline diamond thin films measured by electron field emission. The switching is manifested by the appearance of large jumps in the current emission, up to 4 orders of magnitude, occurring at selected extracting electric field values. The present Examples demonstrate persistent hysteresis whenever the field is ramped down.

Without wishing to be bound by any particular theory, the present Inventors postulate that the experimentally observed phenomena described in these Examples are the result of resonant-tunneling through a double barrier junction composed of ta-C /Nano Diamond/adsorbent layer/vacuum.

Although vacuum-based devices benefit from the highest electron velocity (approximately $3 \times 10^8$ m·s$^{-1}$), yielding high-power and high-frequency devices for microwave amplifiers [5], it is recognized by the present inventors that these devices suffer from a lack of reliable bistable characteristics, low on/off ratios, and inconsistent memory windows. Two-terminal devices based on graphitic compounds are becoming more significant in electronics architectures [6]. It is therefore expected by the present inventors that an electron field emission (FE) process on carbon-based nanostructures can offer superior memory-switching devices once reliable bistability behavior is achieved.

While abrupt switch-on step-like feature has been reported for non-hydrogenated nanocrystalline diamond microtip arrays [19], no hysteresis and no repeatability or reversibility was shown.

The present Example demonstrate the observation of a reversible hysteretic switching in the FE process in Ultrananocrystalline Diamond (UNCD) thin films following surface hydrogenation and exposure to humid air. As a unique property of diamond surface, this surface treatment is responsible for high p-type surface conductivity, as explained by the electrochemical transfer doping model [21-23], and is useful for obtaining the results described below.

The FE measurements performed in the present Examples exhibited consistent electrical bistability with a significant memory window and an on/off ratio of up to 10000:1 in the emitted current density. An extremely sharp switch-on of the electron emission current was demonstrated. It increased abruptly by about 3 orders of magnitude, followed by further successive jumps, each accompanied by plateaus. When the field was ramped down, the FE current remains "on" even at values of the field lower than the initial switch-on values. The FE current turned off abruptly, only at substantially lower fields, showing a pronounced hysteresis (memory) effect. These FE data were repeatable, reversible and were observed consistently from the same emission spot and from other spots on the sample for several hundreds of consecutive cycles (more than 700 cycles) during a continuous operation period of about 20 hours. The phenomenon was found to disappear following in situ heating (300° C.) of the UNCD thin film.

Experimental

The samples used were ultrananocrystalline undoped diamond films [17], about 300 nm thick, grown on quartz by a microwave plasma enhanced process using an Argon rich mixture of Ar/CH$_4$ at a low temperature of 500° C. Surface treatment of the samples consisted of a thorough cleaning in acids and exposure to pure hydrogen plasma in a chemical vapor deposition reactor at 650° C. for 40 minutes followed by exposure to humid air.

Field emission measurements were performed in an ultrahigh vacuum system ($10^{-9}$ torr) at room temperature. A spherical anode "tip" (1 mm radius) was mounted on a computer controlled piezo-driven stage, at distances 20-60 μm from the sample surface. Variable negative voltages (0-5 kV) were applied to the cathode surface relative to the extracting anode. Top silver paint contacts (Ohmic) were used to contact the sample surface with the cathode. The measurements consisted of gradually ramping up the voltage between the cathode and anode, set at fixed distances, while measuring the emission current as function of voltage, or, equivalently, of the electric field E.

The entire experiment was performed automatically under computer control. Several up/down cycles were performed at the same spot as well as at different spots on the same sample and for different cathode-anode set distances. Some measurements were performed (at room temperature) on samples following in situ heating to 300° C.

Results

Surface Characterization

The samples used were UNCD films (300 nm thick) grown on quartz, micro-wave plasma hydrogenated (H) and exposed to humid air.

Figure 1B:
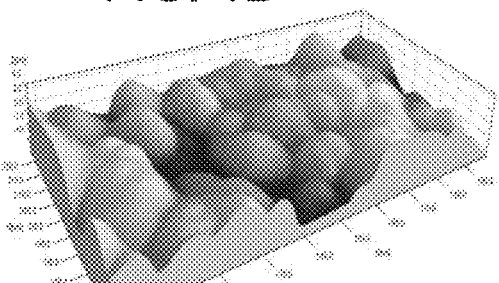
Figure 1C:
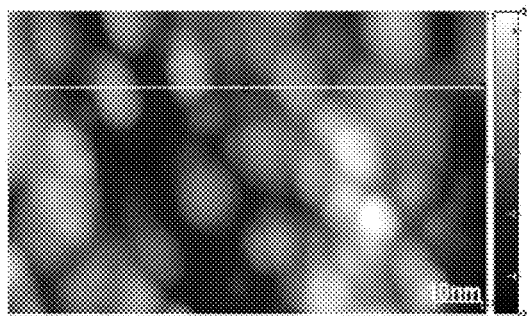
Figure 1D:
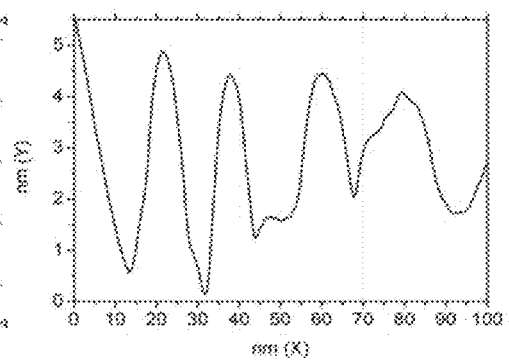

FIG. 1A shows a cross-sectional high-resolution scanned electron microscopy image of a sample. Clear diamond nano grains ranging in size from 5-15 nm were observed (bright regions), separated by amorphous carbon (a-C) nano "pockets", with typical widths ranging between 1.5-2 nm (dark regions). Atomic force microscopy (AFM) measurements which also revealed a surface roughness of 3.5 nm and a high density of nano diamond (ND) grains are consistent with the SEM results. FIG. 1B shows a three dimensional AFM image of the UNCD topography, FIGS. 1C and 1D show a two dimensional AFM image (FIG. 1C), with its corresponding profile (FIG. 1D).

Based on X-Ray Photoelectron Spectroscopy (XPS) measurements, the a-C surrounding the nano diamonds was estimated to contain about 85% of sp$^a$ bonded C. In other words, the ND grains were separated by tetrahedral amorphous carbon (ta-C). A similar conclusion was obtained from previous results of electrical transport measurements done on the same UNCD material [24].

Electrical Observations

Figure 2:
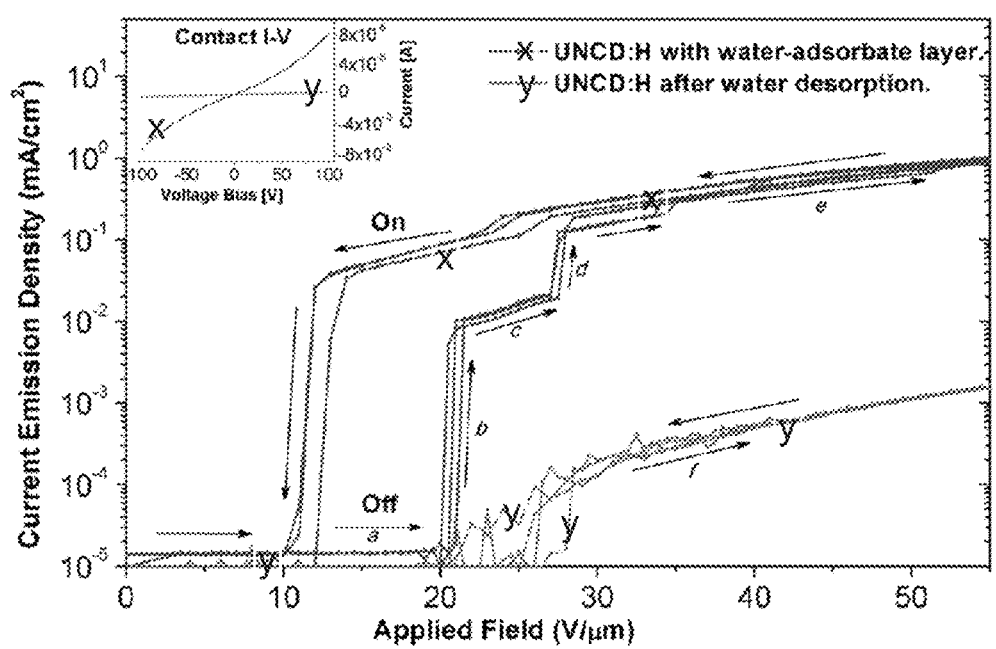
FIG. 2 shows results of current field emission (FE) measurements from UNCD layer, obtained in experiments performed according to some embodiments of the present invention. The x lines show consecutive FE cycles from hydrogenated and humid air exposed UNCD layer, the y lines show consecutive FE cycles from the same sample after in situ heating to 300° C. The inset shows I-V surface contact measurement of the $UNCD:H:H_2O$ before (x line) and after (y line) in situ heating.

FIG. 2 shows the results of repetitive FE measurements on an UNCD sample following surface treatments (cleaning in acids, hydrogen plasma treatment and exposure to humid air). The log of the current density (J) is plotted as a function of the applied electric field (E). The x lines show the results of consecutive cycles of the current density, J(E), measured with the voltage being sequentially ramped up and down. These curves exhibit successive plateaus separated by abrupt jumps. A persistent hysteresis is measured whenever the voltage is ramped down. Similar results were obtained on different samples from the same UNCD wafer, illustrating the reproducibility and reversibility of the results. One virgin sample was subjected to several cycles of repeated heating and H removal followed by new hydrogenation and exposure to humidity.

Figure 3A:
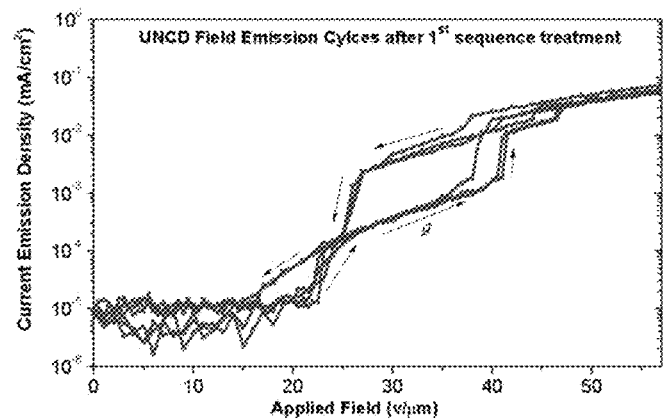
FIGS. 3A-C show progressive improvement of switch-memory properties of FE from UNCD layer following surface treatment sequences.
Figure 3B:
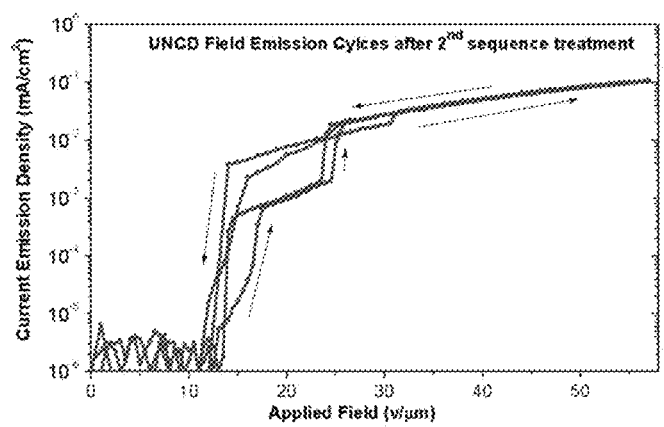
Figure 3C:
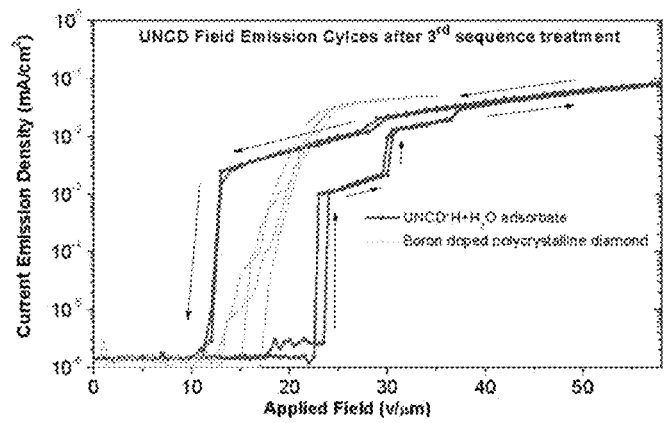

FIGS. 3A-C show progressive improvement of the switch-memory properties of the FE from UNCD layer following surface treatment sequences. FIG. 3A shows FE cycles of a virgin UNCD sample following a single surface treatment, FIG. 3B shows FE cycles of the same sample after a second successive treatment, and FIG. 3C shows FE cycles after a third successive treatment. The gray lines show typical FE cycles from a boron doped polycrystalline diamond for comparison under the same conditions. As shown, the electrical switching properties of the sample have progressively improved.

In a different experiment, the sample was heated, in situ, to 300° C., to remove the water thin layer adsorbate from the UNCD:H surface. FE measurements were repeated after letting the sample cool back down to room temperature into vacuum. The result (FIG. 2, y line) shows reduced and gradual electron emission while ramping the field up and down. I—V surface contact measurements of the UNCD:H:$H_2O$ sample were performed at room temperature before (FIG. 2, inset, x line) and after (FIG. 2, inset, y line) heating. Before heating an almost linear behavior was observed and neither peculiar jumps nor hysteresis effects could be noticed in the I-V cycles. This result suggests that the abrupt jumps and hysteretic FE were not caused by irregularities in the electrical conductivity. Without wishing to be bound to any particular theory, it is postulated that the abrupt jumps and hysteretic FE relate to the electron escape process. After heating, the surface conductivity had vanished, and the sample turned out to be highly insulating.

Discussion

The present results are in contrast with traditional Fowler-Nordheim electron field emission behavior which is characterized, after turn on, by a rather gradual rise in the FE current. As a test case, a FE from a boron doped hydrogen terminated polycrystalline diamond sample was measured under the same experimental conditions. The Fe showed a typical Fowler-Nordheim field emission property (FIG. 3C, gray lines).

Following are several characteristics of the experimental results presented herein.

(i) The FE from the moisture exposed UNCD:H samples switched-on extremely abruptly and exhibited several consecutive jumps.

(ii) Between the jumps, plateaus in the J(E) curves with only moderate increases in the emission current were observed.

(iii) Decreasing the applied field resulted in a completely different behavior: The high emission current was maintained for values of the field substantially lower than those of the ramp-up case (hysteretic behavior). The emission current was characterized by a small and moderated decrease of the current J(E) until an abrupt turn-off occurred, at a remarkably smaller applied field value ($12V_{\mu m}^{-1}$, in the present example) than that of the initial turn on field ($22V_{\mu m}^{-1}$, in the present Example), see FIG. 2. This was noticeable for all J(E) cycles (hysteresis behavior).

(iv) Heating the sample to 300° C. extinguished all of the above phenomena (FIG. 2 y lines).

(v) A repeated surface cleaning followed by micro-wave hydrogen plasma treatment and exposure to humidity, restored and even sharpened the switching effect in the FE (FIG. 3).

The resulting FE properties from the hydrogenated humidity-exposed UNCD thin-film of the present embodiments show a room-temperature reversible hysteretic switching, which exhibit a consistent electrical bistability with endurance of about $10^3$ cycles, memory window of $9\pm1$ $V_{\mu m}^{-1}$, on/off ratio of about $10^4$ in the emitted current density and a switch speed expected to be less than $10^{-14}$ s due to vacuum propagation. These properties are significantly better than conventional memory switches. For example, nanowires metal oxide based materials [1,2], are considered as leading memory technology. These devices show typical on/off ratio up to $10^4$, switching speed of about 50 ns [25], endurance of more than $10^2$ cycles [26]. Molecular [27] and chalcogenide [28] elements show on/off ratios under $10^3$.

Electron emission from solids depends on the properties of the emission sites and on the availability of electrons at these sites. In the present Example, these are affected by the complex structure of the sample, which, as stated, was composed of nanocrystalline diamonds embedded in amorphous carbon, and by the unique electrical properties of the outermost diamond nanocrystallites surface, being H terminated and covered by a thin layer of adsorbed water.

The presently used UNCD samples, when non-hydrogenated, had resistances greater than $10^7$ Ohm per square unit. Upon hydrogenation and exposure to humidity, the resistances dropped to $10^4$ Ohm per square unit with Hall-effect sheet hole concentrations of about $9 \times 10^{11}$ $cm^2$ due to surface transfer doping. This is known, in single crystal diamond, to result in a surface upwards band bending extending to a depth of several nano meters (8-10 nm). Because of the small dimensions of the ND crystallites (5-15 nm) being comparable to the thickness of the band bending, one can assume that the entire volume of the nano crystallites had "turned" p-type. The fact that the observed FE phenomena disappeared after in situ heating at 300° C., a temperature in which the adsorbed water molecules is known to evaporate from the surface of the diamond [29] proved that the observed phenomena was at least partially related to the adsorbed water layer. To this end see, e.g., ref. [30].

Broadly speaking, the FE depends on the emission site, and on the availability of electrons at the emission site. There are at least two different possible types of emission sites from which electrons can escape to vacuum. A first type includes a H terminated water-layer covered diamond nanocrystallite, and a second type includes an amorphous carbon separating the diamond grains or from thin ta-C layers, possibly partially covering the diamond nano grains at the surface. A site of the first type has a negative electron affinity, $\chi=-1.3$ eV, and has undergone a local surface transfer doping which has induced a p-type surface conductivity. In a site of the second type the electron has to overcome a potential vacuum barrier of about 3 eV [31]. Thus, emissions from sites of the second type are expected to increase monotonically with the extracting field [32].

In the present Example, the surface of the sample was successively modified by consecutive surface cleanings, followed by exposure to H plasma. Such treatment is known to etch a-C layers [33] and this has been verified by electron energy loss spectroscopy and XPS measurements. The FE of the sample following repetitive H plasma treatments was found to sharpen (FIGS. 3A-C), and it is postulated that this is because ta-C removal from the UNCD surface. It is therefore assumed that the surface state of the outermost nano diamond grains effect the observed behavior.

For a given emission site, the supply of electrons can, in principle, be via either a surface path or subsurface regions. The pathway along the surface is due to the p-type surface conduction of the nano diamond composed of conductive channels intercepted by the relatively insulating narrow amorphous carbon (ta-C) regions. The pathway below the surface is via ta-C thin regions separated by sections of intrinsic (non-transfer doped) nanocrystallites diamonds. In this pathway, intrinsic nanocrystallites diamonds play the role of insulators and the ta-C pockets are the more conductive part of the composite bulk.

Since the UNCD's FE phenomena were shown to be enhanced following each etching plasma treatment, it is postulated that the emission mechanism primarily originates from H terminated water-layer covered diamond nanocrystallites sites. The sample was composed of ND grains separated by ta-C interlayers. To depict the emission mechanism from the low dimensional sites residing in a complex structure, a simplified representation based on a one-dimensional periodic heterostructure perpendicular to the surface is considered.

FIG. 4 is a schematic band diagram of the nanodiamond grains and ta-C pockets periodic heterostructure, perpendicular to the surface in correspondence to the structural UNCD:H:H$_2$O layer. The outermost transfer doped nano diamond grain (Eg=5.47 eV) having p-type properties and negative electron affinity ($\chi$=−1.3 eV) is covered by a thin water adsorbate layer represented by a quantum well (QW) before the vacuum barrier. The ta-C layer (Eg=2.5 eV) behind, forms a QW between the insulating nano diamond grain (from the bulk) and the outermost nano diamond grain. A, B and C represent the broadened energy levels in the ta-C QW. The red arrows in the structural UNCD layer represent a typical electron pathway to the emission site.

Thus, in model presented in FIG. 4, the two last heterojunctions, behind the surface, are represented by a double barrier tunneling junction composed of ta-C/ND/adsorbent/vacuum. An energy band offset of about 2.5 eV is obtained between the conducting band minima of the internal diamond grain (with band gap energy of $E_g$=5.47 eV and electron affinity of $\chi$=0.5 eV) and ta-C pocket conducting states (with band gap energy of $E_g$=2.5 eV and electron affinity[31] of $\chi$=3 eV). The simplified sub-surface structure is described by a finite rectangular QW formed by the ta-C layer surrounded by two asymmetrical potential barriers, the left one being formed by the insulating diamond grain and the right one being that of hydrogenated and humid-air exposed diamond grain.

The typical width of the ta-C layer separating the nano diamond grains, d, ranges from 1.5 nm to 2 nm (as deduced from the characterization above) is taken as the QW width range. Although the ND grains vary in size from 5-15 nm, the characteristic tunneling distance separating two ta-C regions is on the order of about 1 nm. This is taken as the width of potential barriers through which electrons preferentially tunnel from one ta-C pocket to another.

The spectrum range of the energy levels values, $E_n$, for the ta-C finite QW can be calculated from the Schrodinger's equation solution for a finite potential well [34] with a varying width, d. This approach can be approximated to the solution for the energy levels of an infinite quantum well case, since the differences found in numerical results between the two solutions of this case is small, and also negligible in comparison to each energy level values ranges. The possible energy level range, $\Delta E_n$, are given by the equation:

$$\Delta E_n = (\pi \hbar)^2 n^2 / 2m^*(d)^2 \quad (1)$$

Where QW thicknesses d=1.5-2 nm, n=1, 2, 3 representing the $n^{th}$ energy level, the effective electron mass in ta-C is taken to be of m*=0.87 $m_e$ [35] and $\hbar$ is the reduced Planck constant. This leads to three different subbands with energies ranging between 0.12-0.21 eV, 0.47-0.83 eV, and 1.05-2.5 eV corresponding to the first, second and third broadened energy levels in the representative QW. In this picture the field penetration inside the ta-C QW during the band bending, estimated to be less than 0.04 eV, has been disregarded.

The energy band diagram of the heterostructure in the outermost layer determines the emission properties. The last ta-C QW has asymmetrical potential barriers, where the inner potential barrier is that of the intrinsic ND grain in the bulk, and the outer barrier is that of the hydrogenated and adsorbate-covered ND grain facing the vacuum (with $\chi$=−1.3 eV). The fact that the outermost transfer doped ND grain is, most likely, entirely p-type, results in an upward shift of the last potential barrier. Since the vacuum-facing surface of this grain is covered by a physisorbed acidic water monolayer [36] on its hydrogenated surface [29], a rectangular QW with unoccupied molecular orbitals (UMO) is formed. In thermodynamic equilibrium, the electrochemical potential of the water adsorbate layer, $\mu_e^{ads}$=−5.2 eV, is aligned with the Fermi level of the outermost diamond grain.

Following this model, increasing the applied extracting field can induce band bending along the heterostructure allowing electrons to sequentially tunnel toward the emission sites. This is illustrated in FIGS. 5A-F.

Figure 5:
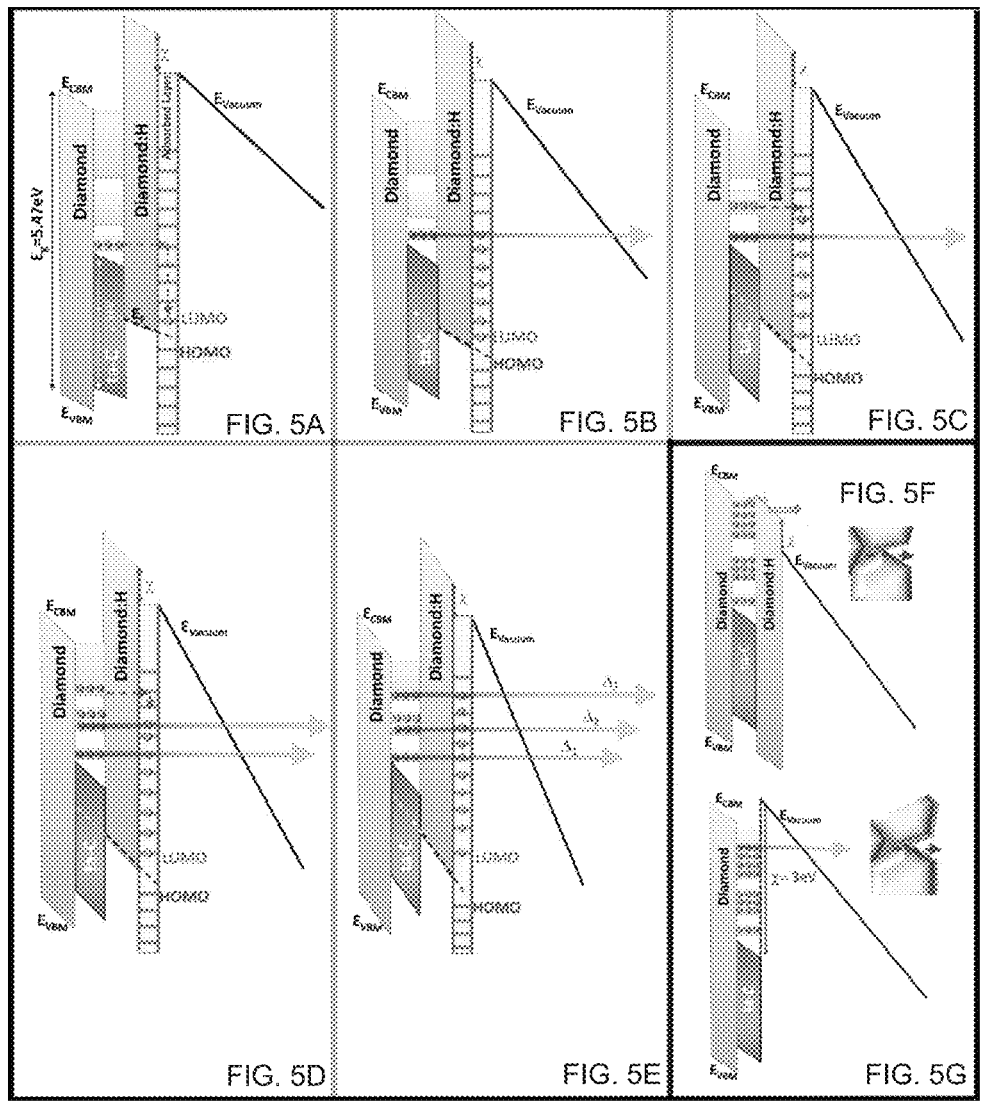
FIGS. 5A-G are schematic illustrations showing band bending of emission site structures following different FE stages as marked on curves in FIGS. 2 and 3A.

Firstly, the electrons first gradually fill the lowest allowed electronic levels (subbands) of the last ta-C QW, located before the outermost nanodiamond surface Thereafter, a resonant tunneling path opens up toward corresponding UMO in the thin water layer QW. FIG. 5A illustrates a UNCD:H:H2O layer during an increasing applied field showing electrons filling from the ta-C QW's electronic levels to the water layer's UMO.

Once electrons fill all lower unoccupied states in the water layer, alignment with ta-C energy levels begins. At this stage, electrons are subjected to a double-barrier resonant tunneling (DBRT), due to the overlap of both ta-C QW and water unoccupied states throughout the outermost nanodiamond grain (first barrier) and the vacuum (second barrier). This DBRT will swiftly boost the transmission probability of the electrons which until now has been almost zero, and give rise to a sudden burst of electrons expressed by an abrupt jump of more than 3 orders of magnitude in the FE current (switch-on), as illustrated in FIG. 5B. This is a current value similar to that which would have been obtained if a gradual turn on FE would have occurred during the increase in the applied field.

A further increase of the applied field will lead to the filling of higher subband levels in the ta-C QW (FIG. 5C), eventually causing further overlaps of ta-C QW and water QW energy levels (FIG. 5D) and resulting in additional DBRT toward vacuum. This results in further jumps in the emission current from higher energy states (FIG. 5E). Between these jumps no significant FE is expected as the supply of electrons is only gradually increased.

The hysteresis during the ramp down of the voltage is caused by the fact that UMO states in the water layer QW are kept charged from the upward field sweep. The electron emission sustains as long as the bias voltage allows electron transport over aligned states of both ta-C and water QWs to favorite DBRT. Decreasing the voltage diminishes the carriers' supply to the QWs and gradually cancels overlapping states due to energy level shift. Therefore, a gradual decline in the emission current with a slight hump takes place. Then, an abrupt switch off occurs when no replenishment and/or no alignment of energy levels any longer exist, thus promptly impeding DBRT conditions.

This mechanism results in the formation of a memory effect in the current emission for any upward-downward cycle of the applied field.

The above mechanism is confirmed by the results of the in situ, heating (300° C.) experiments. In this state, transfer doping and water adsorbate is removed resulting in very poor FE with no hysteresis (FIG. 2, y line). The resulting energy band diagram is a symmetric aligned heterostructure of all the nanodiamond potential barriers as represented in FIG. 5F. The emission process is now governed by electrons transferring from ta-C QW's to the conduction band minima of the outermost nanodiamond, still benefiting from NEA, before escaping to vacuum. The FE between the abrupt jumps was found to be monotonous and to follow the standard Fowler-Nordheim (FN) behavior given by:

$$\ln\left(\frac{J}{E^2}\right) = -6.83 \cdot 10^7 \frac{\phi^{3/2}}{\beta} \frac{1}{E} + C \quad (2)$$

Figure 6:
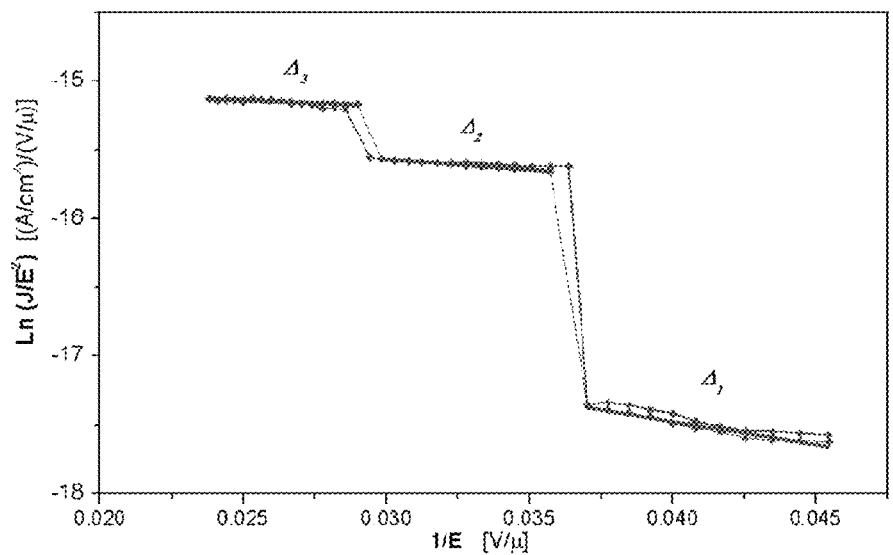
FIG. 6 shows Fowler-Nordheim plots of FE cycles from $UNCD:H:H_2O$.

According to EQ. 2, for FN behavior a plot of $\ln(J/E^2)$ as a function of $1/E$ should yield a straight line with a slope, $\Delta$, given by $\Delta = \phi^{3/2}/\beta$, with $\phi$ being the work function and fi the geometric field enhancement factor. The FN plot of the FE data in the regions between the abrupt jumps is shown in FIG. 6. As shown, the plots consists of straight lines with ever decreasing slopes ($\Delta_1 > \Delta_2 > \Delta_3$). The differences between the respective slopes of each plateau indicate that consecutive current steps are from states with a lower effective barrier ($\phi_1 > \phi_2 > \phi_3$ with $\phi_1$, $\phi_2$ and $\phi_3$ corresponding to the first, second and third current jumps), demonstrating that FE of consecutive steps originate from higher energy levels.

Quantitative analysis of the three lines of the FN plot, taking $\beta=10$ for all plateaus (as roughly deduced from the UNCD surface smoothness), yields $\phi_1=2.8\pm0.1$ eV, $\phi_2=1.6\pm0.4$ eV and $\phi_3=1.2\pm0.3$ eV. A rough comparison of these qualitative values agrees with the three energy levels ranges which yield to effective barriers ranges $\phi_1=2.6$-$2.8$ eV, $\phi_2=2.0$-$2.4$ eV and $\phi_3=0.4$-$1.9$ eV described by the emission mechanism from first, second and third energy subbands in the representative ta-C QWs.

FIG. 5G schematically illustrates the band banding for UNCD:H covered by ta-C thin layer under applied field before the surface treatment sequences.

The present example demonstrated reversible memory switching of current field emission in hydrogen-terminated humidity covered ultrananocrystalline diamond layers.

The current emission observations for the sequenced surface treatments of a UNCD layer showed progressive improvement in the switching hysteresis and the in situ heating (evaporation of water layer from the surface) annulled all current emission phenomena from the sample.

A simplified model relying on characterizations results and physical properties can be employed to explain the experimental observations. The model describes the material as being composed of a sequence of heterojunctions formed by ta-C QW and ND barriers. The last two heterojunctions (ta-C/ND/adsorbate layer/vacuum) form a double barrier tunneling junction where resonance tunneling occurs when the energy levels of the ta-C QW are aligned with those of the adsorbate layer. The experimental findings described in this Example present a new hysteresis phenomenon in electron field emission.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

REFERENCES

[1] W. Lu, C. M. Lieber, Nature Mater. 2007, 6, 841.
[2] J. Ouyang, C. W. Chu, C. R. Szmanda, L. Ma, Y. Yang, Nature Mater. 2004, 3, 918-922.
[3] D. R. Stewart, D. A. A. Ohlberg, P. A. Beck, Y. Chen, S. R. Williams, J. O. Jeppesen, K. A. Nielsen, J. F. Stoddart, NanoLett. 2004, 4, 133-136.
[4] S. Bhattacharyya, S. J. Henley, E. Mendoza, L. Gomez-Rojas, J. Allam, S. R. P. Silva, Nature Mater. 2005, 5, 19-22.
[5] K. B. K. Teo, E. Minoux, L. Hudanski, F. Peauger, J. P. Schnell, L. Gangloff, P. Legagneux, D. Dieumegard, G. A. J. Amaratunga, W. I. Milne, Nature. 2005, 437, 968.
[6] Y. Li, A. Sinitskii, J. M. Tour, Nature Mater. 2008, 7, 966-971.
[7] V. Litovchenko, A. Evtukh, Y. Kryuchenko, N. Goncharuk, O. Yilmazoglu, K. Mutamba, H. L. Hartnagel, D. Pavlidis, J. Appl. Phys. 2004, 96, 867.
[8] A. V. Karabutov, V. D. Frolov, V. I. Konov, Diamond Rel. Mat. 2001, 10, 840-846.
[9] V. Semet, V. T. Binh, J. P. Zhang, J. Yang, M. A. Khan, R. Tsu, Appl. Phys. Lett. 2004, 84, 1937.
[10] R. Z. Wang, H. Yan, B. Wang, X. W. Zhang, X. Y. Hou, Appl. Phys. Lett. 2008, 92, 142102.
[11] L. D. Filip, M. Palumbo, J. D. Carey, S. R. P. Silva, Phys. Rev. B. 2009, 79, 245429.
[12] W. M. Tsang, S. J. Henley, V. Stolojan, S. R. P. Silva, Appl. Phys. Lett. 2006, 89, 193103.
[13] L. Gan, E. Baskin, C. Saguy, R. Kalish, Phys. Rev. Lett. 2006, 96, 196808.
[14] T. Yamada, S. Shikata, C. E. Nebel, J. Appl. Phys. 2010, 107, 013705.
[15] E. W. Plummer, J. W. Gadzuk, R. D. Young, Solid State Commun. 1969, 7, 487.

[16] Duke, C. B.; Alfereiff, M. E. Field emission through atoms adsorbed on a metal surface J. Chem. Phys. 1967, 46, 923.
[17] Gadzuk, J. W.; Plummer, E. W. Field emission energy distribution. Rev. Mod. Phys. 1973, 45, 487.
[18] Lyth, S. M.; Silva, S. R. P. Resonant behavior observed in electron field emission from acid functionalized multiwall carbon nanotubes. Appl. Phys. Lett. 2009, 94, 123102.
[19] J. C. Madaleno, M. K. Singh, E. Titus, G. Cabral, J. Gracio, L. Pereira, Appl. Phys. Lett. 2008, 92, 23113.
[20] D. M. Gruen, Rev. Mater. Sci. 1999, 29, 211.
[21] F. Maier, M. Riedel, B. Mantel, J. Ristein, L. Ley, Phys. Rev. Lett. 2000, 85, 3472.
[22] P. Strobel, M. Riedel, J. Ristein, L. Ley, Nature. 2004, 430, 439.
[23] V. Chakrapani, J. C. Angus, A. B. Anderson, S. D. Wolter, B. R. Stoner, G. U. Sumanasekera, Science. 2007, 318, 1424.
[24] L. Gan, C. Saguy, R. Kalish, D. L. Tan, B. K. Tay, D. Gruen, P. Bruno, Diamond Relat. Mater. 2009, 18, 1118.
[25] J. J Yang, M. D. Pickett, X. Li, D. A Ohlberg, D. R. Stewart, R. S. Williams. Nature Nanotech. 2008, 3, 429.
[26] J. G. Park, W. S. Nam, S. H. Seo, Y. G. Kim, Y. H. Oh, G. S. Lee, U. G. Palik, NanoLett. 2009, 9, 4, 1713.
[27] E. J. Green, J. W. Choi, A. Boukai, Y. Bunimovich, E. Johnston-Halperin, E. DeIonno, Y. Lu, B. A. Sheriff, K. Xu, Y. S. Shin, H. R. Tseng, J. F. Stoddart, J. R. Heath, Nature. 2007, 445, 414-417.
[28] H. Goronkin, Y. Yang, Mater. Res. Soc. Bull. 2004, 29, 805-808.
[29] A. Laikhtman, A. Lafosse, Y. Le Coata, R. Azriaa, A. Hoffman, Surf. Sci. 2004, 551, 99-105.
[30] A. Bolker, C. Saguy, M. Tordjman, L. Gan, R. Kalish, Phys. Rev. B. 2011, 83, 155434.
[31] J. Robertson, Mater. Sci. Eng. R. Rep. 2002, 37, 129-281.
[32] B. S. Satyanarayana, A. Hart, W. I. Milne, J. Robertson, Appl. Phys. Lett. 1997, 71, 1430.
[33] M. Yeganeh, P. R. Coxon, A. C. Brieva, V. R. Dhanak, L. Šiller, Y. V. Butenko, Phys. Rev. B. 2007, 75, 155404.
[34] L. D. Landau, E. M. Lifshitz, Quantum Mechanics non-relativistic theory, 3 ed. 1977. p 64.
[35] A. C. Ferrari, A. Libassi, B. K. Tanner, V. Stolojan, J. Yuan, L. M. Brown, S. E. Rodil, B. Kleinsorge, J. Robertson, Phys. Rev. B. 2000, 62, 11089.
[36] J. J. Mareša, P. Hubík, J. Kristofik, J. Ristein, P. Strobel, L. Ley, Diamond Relat. Mater. 2008, 17, 1356-1361.

What is claimed is:

1. A field-emission device, comprising a solid state structure formed of a crystalline material which comprises a plurality of crystalline nanostructures and an amorphous material, wherein an outer surface of said solid state structure comprises a portion of said crystalline nanostructures and is substantially devoid of said amorphous material, and wherein a p-type conductivity of said crystalline material is higher at said outer surface which is substantially devoid of said amorphous material than far from said outer surface which is substantially devoid of said amorphous material, and wherein said portion of said crystalline nanostructures protrude outwardly from said amorphous material.

2. The device of claim 1, wherein said crystalline nanostructures are embedded in said amorphous material.

3. The device of claim 2, wherein said crystalline nanostructures are characterized by an average diameter of from about 3 nm to about 30 nm, and wherein an average distance between adjacent crystalline nanostructures is less than 3 nm.

4. The device of claim 2, wherein said crystalline nanostructures are diamond nanostructures.

5. The device of claim 4, wherein said amorphous material is amorphous carbon.

6. The device of claim 4, wherein said amorphous material is tetrahedral amorphous carbon.

7. The device of claim 1, wherein said crystalline material comprises at least one structure selected from the group consisting of a diamond multilayer structure, a fullerene multilayer structure, a carbon nanotube multilayer structure, a graphene layer structure, and a graphene multilayer structure.

8. The device of claim 1, wherein said crystalline material comprises at least one layer selected from the group consisting of a homoepitaxial diamond layer, a polycrystalline diamond layer, and a layer of diamond nanostructures.

9. The device of claim 1, wherein said surface is modified by foreign atoms.

10. The device of claim 9, wherein said foreign atoms are covalently attached to said surface.

11. The device of claim 9, wherein said foreign atoms are hydrogen atoms.

12. The device of claim 9, wherein said foreign atoms comprise at least one atom are selected from the group consisting of oxygen, nitrogen, fluorine, boron and phosphor.

13. The device of claim 1, further comprising an adsorbed layer at said outer surface.

14. The device of claim 13, wherein said adsorbed layer is characterized by a chemical potential below a characteristic valence band energy level of said surface.

15. The device of claim 13, wherein said adsorbed layer is characterized by electron affinity above 4.2 eV.

16. The device of claim 13, wherein said adsorbed layer is an aqueous layer.

17. The device of claim 13, wherein said adsorbed layer comprises at least one substance selected from the group consisting of fullerene and fullerene fluorinated.

18. The device of claim 1, wherein a thickness of said adsorbed layer is from about 0.1 nm to about 10 nm.

19. The device of claim 1, wherein said solid state structure is characterized by a current-voltage hysteresis loop at room temperature.

20. The device of claim 1, wherein said solid state structure features a current rise of at least two orders of magnitude over a change of less than 50% in voltage bias applied to said solid state structure.

21. A display system, comprising the device of claim 1.

22. An X-ray source system, comprising the device of claim 1.

23. An electron emission system, comprising the device of claim 1.

24. An electron microscope, comprising the device of claim 1.

25. An electrical switch system, comprising the device of claim 1.

26. A logic circuit, comprising the device of claim 1.

27. A memory system, comprising the device of claim 1.

28. A sensor system, comprising the device of claim 1.

29. A method of producing current, comprising applying voltage to a solid state structure formed of a crystalline material which comprises plurality of crystalline nanostructures and an amorphous material, wherein an outer surface of said solid state structure comprises a portion of said crystalline nanostructures and is substantially devoid of said amorphous material, and wherein a p-type conductivity of said crystalline material is higher at said outer surface which is substantially devoid of said amorphous material than far from said outer surface which is substantially devoid of said amorphous material, and wherein said portion of said crystalline nanostructures protrude outwardly from said amorphous material.

* * * * *